(12) United States Patent
Mouri

(10) Patent No.: US 6,495,852 B1
(45) Date of Patent: Dec. 17, 2002

(54) GALLIUM NITRIDE GROUP COMPOUND SEMICONDUCTOR PHOTODETECTOR

(75) Inventor: Hirokazu Mouri, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 15 days.

(21) Appl. No.: 09/597,995

(22) Filed: Jun. 19, 2000

(30) Foreign Application Priority Data

Jun. 24, 1999 (JP) ............................................. 11-178998

(51) Int. Cl.$^7$ ................................................ H01L 29/06
(52) U.S. Cl. ............................ 257/21; 257/18; 257/458
(58) Field of Search ............................ 257/21, 14, 18, 257/458, 461, 462, 464

(56) References Cited

U.S. PATENT DOCUMENTS

| | | | | |
|---|---|---|---|---|
| 4,873,555 A | * | 10/1989 | Coon et al. .................. | 357/4 |
| 5,389,797 A | * | 2/1995 | Bryan et al. ................. | 257/21 |
| 5,767,507 A | * | 6/1998 | Unlu et al. .................. | 250/225 |
| 5,834,331 A | * | 11/1998 | Razeghi ...................... | 438/40 |
| 6,165,812 A | * | 12/2000 | Ishibashi et al. ............. | 438/46 |
| 6,229,151 B1 | * | 5/2001 | Takeuchi et al. .............. | 257/14 |
| 6,265,727 B1 | * | 7/2001 | Kozodoy et al. .............. | 257/21 |

FOREIGN PATENT DOCUMENTS

JP          7-288334          10/1995

* cited by examiner

*Primary Examiner*—Sara Crane
(74) *Attorney, Agent, or Firm*—Nixon & Vanderhye PC

(57) ABSTRACT

A gallium nitride group compound semiconductor photodetector includes a substrate and a multilayer structure provided on the substrate. The multilayer structure includes an n-type gallium nitride group compound semiconductor layer, a p-type gallium nitride group compound semiconductor layer, and a light detecting layer provided between the n-type gallium nitride group compound semiconductor layer and the p-type gallium nitride group compound semiconductor layer. The light detecting layer has a quantum well structure includes a quantum well layer of $In_xGa_{1-x}N$ (0<x<1) and a barrier layer of $In_yGa_{1-y-z}Al_zN$ (0≦y<1, 0≦z≦1, y+z<1).

30 Claims, 16 Drawing Sheets

GALLIUM NITRIDE GROUP COMPOUND SEMICONDUCTOR PHOTODETECTOR

BACKGROUND OF THE INVENTION

1. Field of the Invention

The present invention relates to a photodetector made of a gallium nitride group compound semiconductor material and capable of detecting a light having a wavelength range about 390 nm to about 500 nm (hereinafter referred to as a gallium nitride group compound semiconductor photodetector).

2. Description of the Related Art

Photodiodes made of silicon, which can be integrated into a variety of circuits, are preferably used as photodetectors in the technological field of information equipment using light.

There is however the following problem with the silicon photodiode. An optical pickup uses light to read and write optical recording information or to perform servo control of these operations. Such light may have a wavelength of as small as about 600 nm or less in an attempt to achieve higher-density optical disks or the like. However, silicon has a low photosensitivity to the light having a wavelength of about 600 nm or less. The light detection peak wavelength (where the photosensitivity is maximized) of silicon is about 800 nm. The shorter the wavelength of light from about 800 nm, the greater the absorption coefficient of silicon, i.e., the more the loss due to absorption at a surface and surface recombination. For instance, the photosensitivity to light of about 600 nm is about 60% of the peak value; and 20% with respect to light of about 400 nm. Thus, the shorter the wavelength, the lower the photosensitivity. There has been a demand for a photodetector having a high photosensitivity to light having a short wavelength of about 600 nm or less.

Japanese Laid-Open Publication No. 7-288334 discloses a photodetector having a photosensitivity to light having a wavelength of 365–635 nm. This photodetector has a double-hetero structure in which an InGaN layer functions as a light detecting layer is provided between p-type and n-type gallium nitride group compound semiconductor layers.

FIG. 13 is a cross-sectional view illustrating the structure of a photodetector made of a gallium nitride group compound semiconductor material according to the above described conventional technology.

The conventional photodetector shown in FIG. 13 includes a buffer layer 132 of GaN, an n-type contact layer 133 of n-type GaN, an n-type cladding layer 134 of n-type $Ga_{0.9}Al_{0.1}N$, a light detecting layer 135 of $In_{0.1}Ga_{0.9}N$, a p-type cladding layer 136 of p-type $Ga_{0.9}Al_{0.1}N$, and a p-type contact layer 137 of p-type GaN, which are successively provided on a sapphire substrate 131. The photodetector further includes a Ni—Au electrode (p-side electrode) 138 provided on the p-type GaN contact layer 137 and a Ti—Al electrode (n-side electrode) 139 on an exposed surface of the n-type GaN contact layer 133. The thickness of the InGaN light detecting layer 135 is about 0.1 μm.

A plurality of such photodetectors having the same structure shown in FIG. 13 but different light detection peak wavelengths were prepared by changing a molar fraction of In in the InGaN light detecting layer 135. The sensitivity of each photodetector was measured at its light detection peak wavelength. Results are shown in FIG. 14. FIG. 14 shows a relative photosensitivity where the photosensitivity to light having a wavelength of about 365 nm is regarded as 1.

As is seen from FIG. 14, a relative photosensitivity of about 0.38 was obtained with respect to a wavelength of about 380 nm; about 0.2 with respect to a wavelength of about 390 nm; and about 0.07 with respect to a wavelength of about 410 nm. The longer the light detection peak wavelength, the more significant the reduction in photosensitivity.

The light detection peak wavelength of the light detecting layer of InGaN can be controlled by adjusting the In molar fraction of the InGaN. A relatively small In molar fraction of InGaN causes the light detection peak wavelength to fall within the range of about 380 nm or less. To obtain a photodetector having a light detection peak wavelength of about 380 nm or more, the In molar fraction in the light detecting layer needs to be increased. It is however difficult to obtain an InGaN film having satisfactory crystallinity as well as a high In molar fraction. In the case of a thick film having a thickness of about 0.1 μm, for instance, the more the In molar fraction (i.e., the longer the light detection peak wavelength), the more significant the degradation in crystallinity of the light detecting layer, resulting in an increase in dark current. This causes a significant reduction in the light detecting sensitivity with an increase in the light detection peak wavelength, which is shown in FIG. 14.

As described above, in the conventional photodetector including the InGaN light detecting layer, the longer the light detection peak wavelength, the more significant the reduction in photosensitivity.

SUMMARY OF THE INVENTION

A gallium nitride group compound semiconductor photodetector according to the present invention includes a substrate; and a multilayer structure provided on the substrate. The multilayer structure includes an n-type gallium nitride group compound semiconductor layer; a p-type gallium nitride group compound semiconductor layer; and a light detecting layer provided between the n-type gallium nitride group compound semiconductor layer and the p-type gallium nitride group compound semiconductor layer. The light detecting layer has a quantum well structure including a quantum well layer of $In_xGa_{1-x}N$ (0<x<1); and a barrier layer of $In_yGa_{1-y-z}Al_zN$ (0≦y<1, 0≦z≦1, y+z<1).

In one embodiment, the multilayer structure is provided in a direction parallel to the c-axis of the gallium nitride group compound semiconductor layers.

In one embodiment, the substrate is any one of a sapphire substrate, a SiC substrate, and a GaN substrate.

In one embodiment, the quantum well structure of the light detecting layer is a single-quantum well structure.

In one embodiment, the quantum well structure of the light detecting layer is a multi-quantum well structure.

In one embodiment, the number of quantum well layers included in the quantum well structure of the light detecting layer is in the range of about 1 to about 70.

In one embodiment, the width of each quantum well layer included in the quantum well structure of the light detecting layer is in the range of about 1 nm to about 15 nm.

Thus, the invention described herein makes possible the advantages of providing a photodetector having an improved photosensitivity to light having a wavelength in the range of about 390 nm to about 500 nm.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 1:
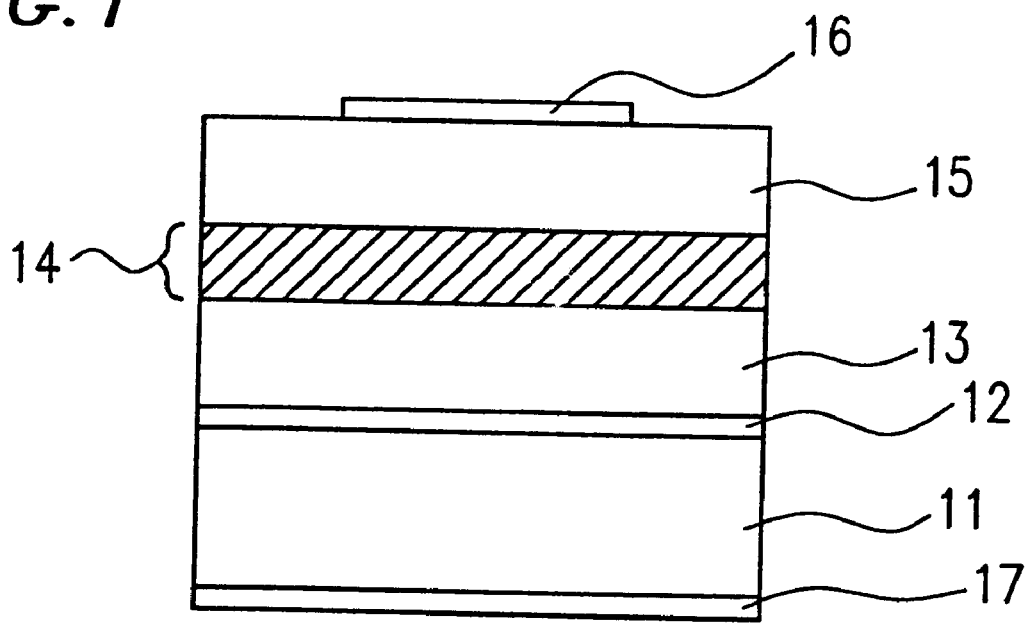
FIG. 1 is a cross-sectional view illustrating a structure of a photodetector according to Example 1 of this invention.

FIG. 1 is a cross-sectional view illustrating a structure of a photodetector according to Example 1 of this invention.

Specifically, the photo detector shown in FIG. 1 includes a GaN buffer layer 12 (about 40 nm thick), a GaN:Si layer 13 (about 3 μm thick), a Multi-Quantum-Well (MQW) light detecting layer 14 including about 20 sets of an $In_{0.26}Ga_{0.74}N$ layer (about 4 nm thick) and a GaN layer (about 6 nm thick); and a GaN:Mg layer 15 (about 1 μm thick), which are successively provided on an n-type 6H-SiC $(0001)_{si}$ substrate 11. The GaN:Mg layer 15 in the multilayer structure has been subjected to annealing to become a low resistance p-type GaN layer 15. The photodetector further includes a p-side electrode 16 of Ni—Au provided on the p-type GaN:Mg layer 15 and an n-side electrode 17 of Ni on the rear surface of the n-type SiC substrate 11. Note that a direct current ammeter was connected between the electrodes 16 and 17 when light detection characteristics (photocurrent spectra) were measured as described below.

The photodetector thus obtained was irradiated with monochromatic light from above the p-type GaN layer 15. The monochromatic light is obtained by separating white light of a xenon lamp into a spectrum. A photosensitivity described below is a relative photosensitivity where the photosensitivity to light having a wavelength of about 365 nm is regarded as a reference value 1. The same applies to the other examples of this invention.

The photodetector of Example 1 including the MQW light detecting layer 14 as shown in FIG. 1 has a light detection peak wavelength of about 460 nm. The light detection peak wavelength refers to the wavelength at which the current is maximum in the photocurrent spectra measured using the above-mentioned method. The relative photosensitivity to light having this wavelength is about 0.65. To compare with the photodetector of Example 1, a photodetector including a single InGaN layer having a thickness of about 0.1 μm as a light detecting layer (the light detection peak wavelength is about 460 nm which is the same as that of Example 1) was prepared and the photosensitivity thereof was measured in a similar way. The relative photosensitivity to light having a wavelength of about 460 nm is about 0.04. Thus, it was demonstrated that the MQW structure of the light detecting layer 14 leads to an improvement in photosensitivity by a factor of about 16.

Hereinafter, a reason of the improvement in photosensitivity by this invention will be described.

In general, a gallium nitride group compound semiconductor material has a large piezoelectric constant. In the multilayer structure as shown in FIG. 1 including the InGaN layers and the GaN layers, a difference in the lattice constant between an InGaN layer and a GaN layer causes a large compressive strain which is applied to the InGaN layer. A large internal electric field (piezoelectric field) is generated due to a piezoelectric effect caused by the compressive strain. The direction of the internal electric field thus generated is opposite to that of an electric field caused by a pn junction. As described above, in this invention, the photosensitivity is improved using the internal electric field (piezoelectric field) generated by the piezoelectric effect.

In the photodetector shown in FIG. 1, the multilayer structure is provided on the (0001) plane of the substrate 11. The substrate may be a SiC substrate which has a crystal structure different from 6H. A plane on which the multilayer structure is provided may not be. the (0001) plane. The photosensitivity is improved most when the generated piezoelectric field has a direction perpendicular to a growing surface. Thus, the multilayer structure is preferably provided in a direction parallel to the c axis of the gallium nitride group compound semiconductor layer so that the piezoelectric field is generated significantly in a direction perpendicular to the growing surface.

Figure 2:
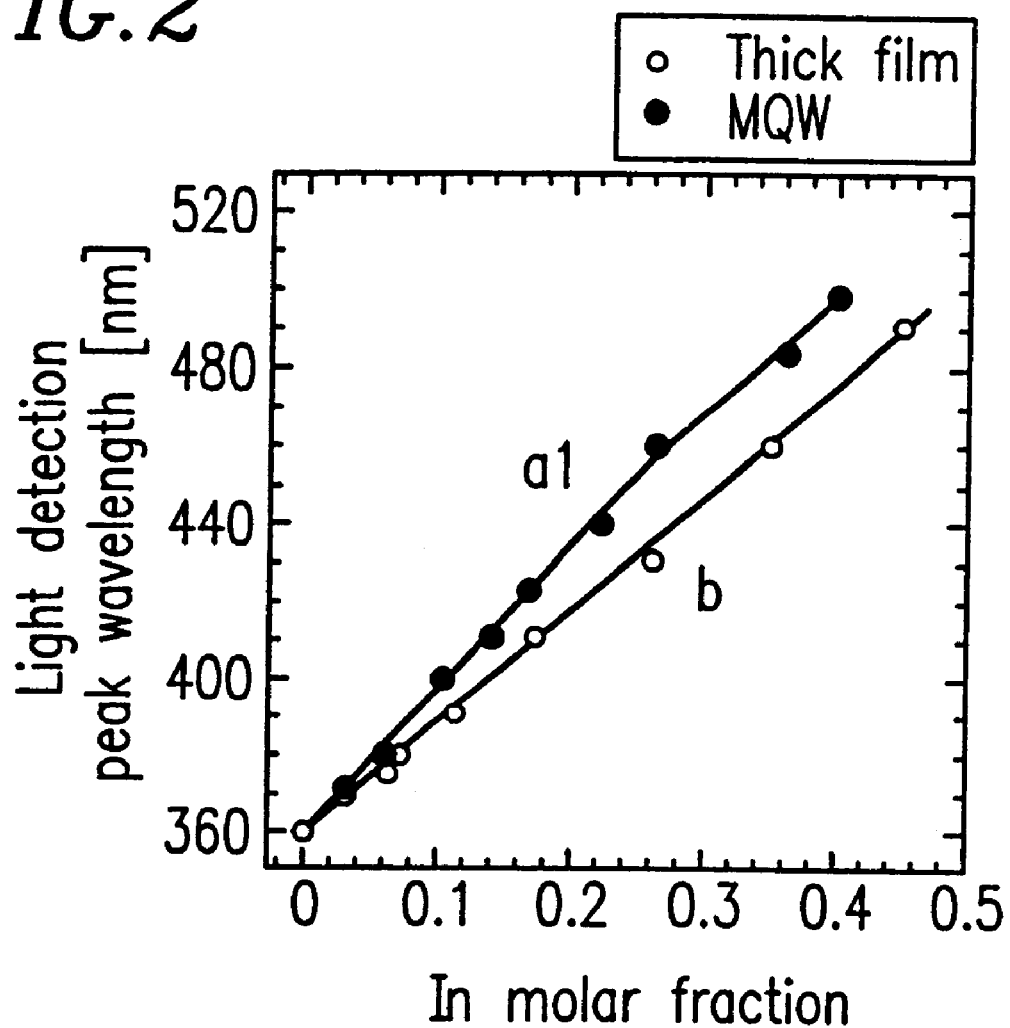
FIG. 2 is a diagram showing a relationship between the In molar fraction and light detection peak wavelength of a light detecting layer of the photodetector according to Example 1 of this invention or a conventional photodetector.

In this invention, the light detecting layer has the quantum well structure. In accordance with the quantum confinement Stark effect, transition energy is more decreased in the presence of an electric field due to the piezoelectric effect than in the absence of an electric field (the light detection peak wavelength is shifted toward a longer wavelength). A change in the transition energy (corresponding to the light detection peak wavelength) was measured by an experiment. FIG. 2 shows a result when a change in light detection peak wavelength was measured by changing the In molar fraction of the light detecting layer. In FIG. 2, curve a1 indicates characteristics of the photodetector of Example 1 including the light detecting layer having the InGaN/GaN MQW structure. Curve b indicates characteristics of the conventional photodetector including the light detecting layer having the InGaN thick film having a thickness of about 0.1 μm.

As is seen from FIG. 2, to obtain the same light detection peak wavelength, the structure of Example 1 having the MQW light detecting layer (characteristics a1) has a smaller In molar fraction than that of the conventional structure having the thick light detecting layer (characteristics b). For instance, to obtain a light detection peak wavelength of about 460 nm, the photodetector having the conventional structure needs an In molar fraction of about 0.35, while the photodetector having the structure of Example 1 needs an In molar fraction of about 0.26. The In molar fraction can be reduced in Example 1 as compared with that of the conventional photodetector.

A plurality of photodetectors having different light detection peak wavelengths were prepared by changing the In molar fraction of the light detecting layers. The relationship between the light detection peak wavelengths and the relative photosensitivity (described above) was obtained. The result is shown in FIG. 3.

Figure 3:
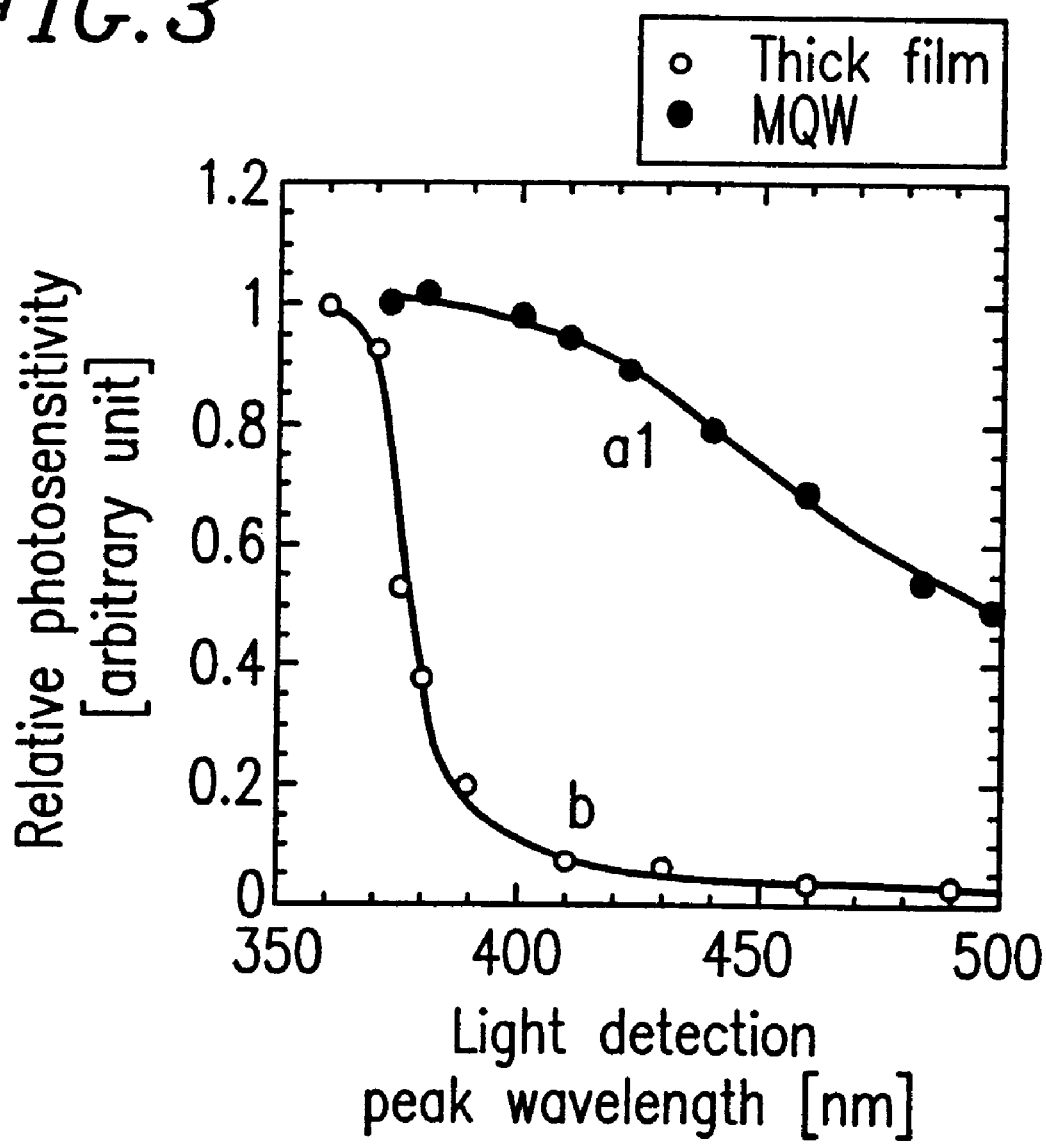
FIG. 3 is a diagram showing a relationship between the light detection peak wavelength and photosensitivity of the photodetector according to Example 1 of this invention or the conventional photodetector.

Curve b in FIG. 3 indicates characteristics of the conventional photodetector including the InGaN thick film having a thickness of about 0.1 μm as the light detecting layer. The longer the light detection peak wavelength, the more significant the reduction in photosensitivity. The reason is the same as described above. An increased In molar fraction of the light detecting layer is required to obtain a photodetector having a long light detection peak wavelength. The increased In molar fraction leads to prevention of the InGaN thick film from having satisfactory crystallinity. The more the In molar fraction (the longer the light detection peak wavelength), the more the degradation in crystallinity of the light detecting layer.

Additionally, curve a1 in FIG. 3 indicates characteristics of the photodetector of Example 1 including the light detecting layer having the InGaN/GaN MQW structure. As compared with curve b (the case of the InGaN thick film), the photosensitivity is improved by a factor of about 5 to about 16 in the light detection peak wavelength range of about 390 nm to about 500 nm. Thus, as compared with the case of the conventional InGaN thick film light detecting layer, a smaller amount of In is required to obtain a light detecting layer having a longer light detection peak wavelength. This is because the light detection peak wavelength is shifted due to the quantum confinement Stark effect in the presence of the piezoelectric field caused by the lattice strain. Therefore, the problem with the conventional InGaN thick film light detecting layer that the increased In amount leads to degradation in crystallinity of the light detecting layer can be avoided, thereby obtaining an improvement in photosensitivity.

Even as to the characteristics a1, the longer the light detection peak wavelength, the lower the photosensitivity. The following two functions are responsible for this reduction. One of the two functions is the degradation of crystallinity which occurs in the MQW structure due to an increase in the In molar fraction, though it is not as significant as in the thick film. The other function is as follows. The more the In molar fraction, the more the strain amount due to a difference in the lattice constant. The increased strain amount causes the piezoelectric effect which leads to an increase in an electric field applied to the quantum well. This further leads to a decrease in oscillator strength, thereby reducing an optical transition probability.

Figure 4A:
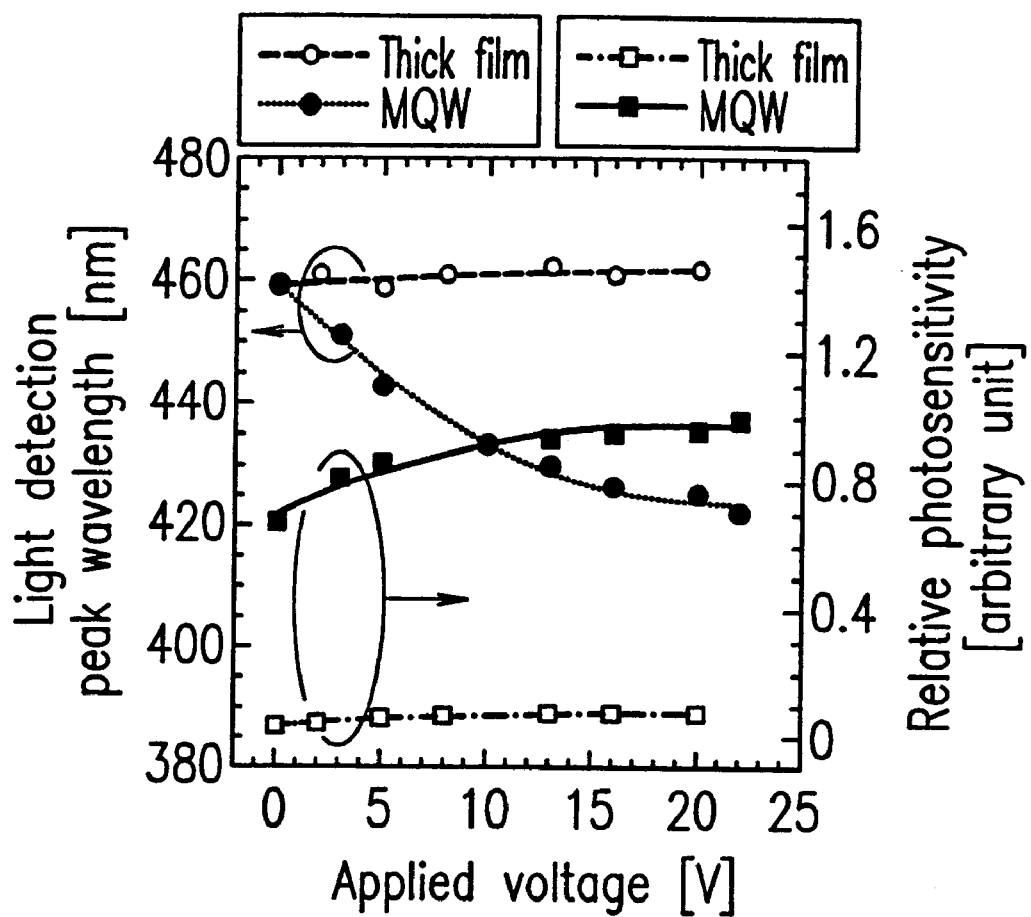
FIG. 4A is a diagram showing a relationship between external applied voltage and light detection peak wavelength and a relationship between the external applied voltage and photosensitivity, of the photodetector according to Example 1 of this invention or the conventional photodetector.

FIG. 4A is a diagram showing a result of measurement of changes in a light detection peak wavelength and photosensitivity which are obtained in the presence of voltage externally applied to the photodetector of Example 1. The p side of the photodetector is biased to be negative and the n side is biased to be positive so that the pn junction is reverse biased by the applied voltage.

Figure 4B:
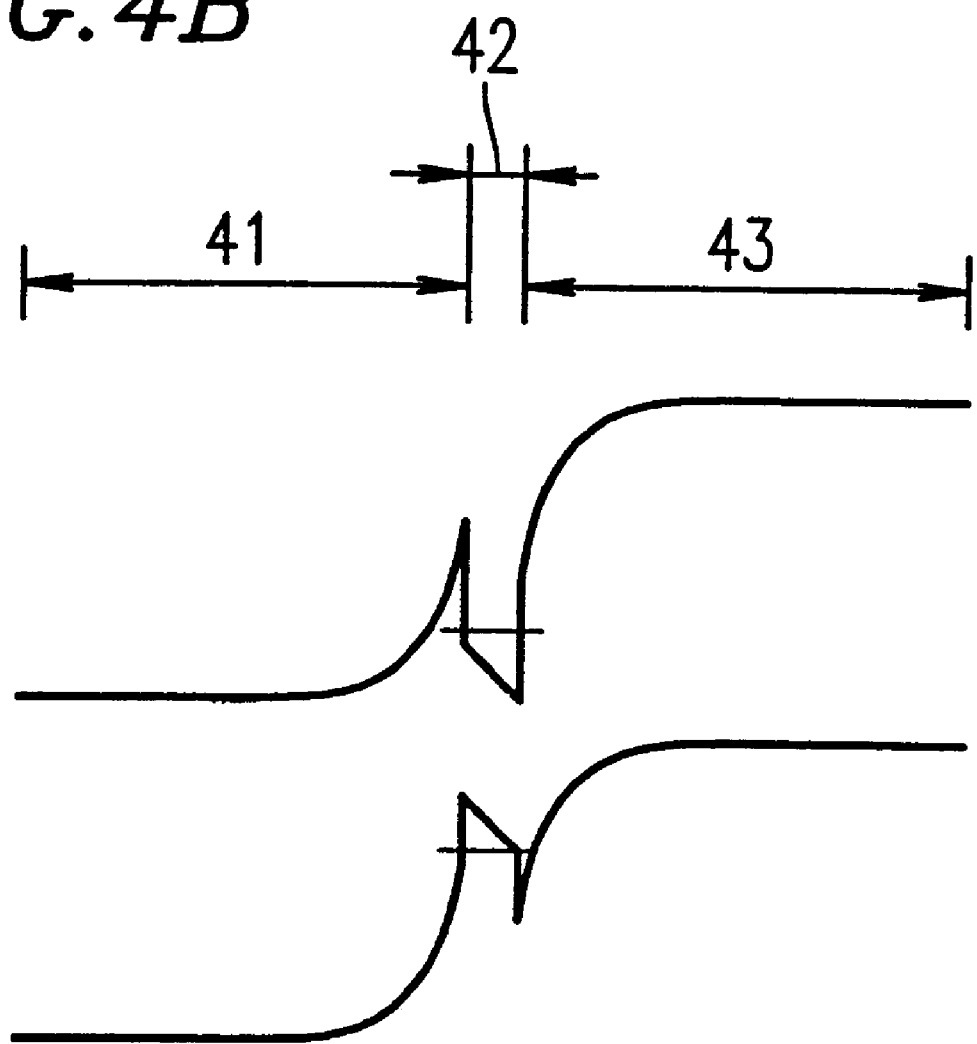
FIG. 4B is a diagram showing an energy band structure in the vicinity of the light detecting layer of the photodetector according to Example 1 of this invention.

Black circles in FIG. 4A represent a change in the light detection peak wavelength of the photodetector of Example 1. The light detection peak wavelength is shifted toward a short wavelength with an increase in the applied voltage (reverse bias voltage). This point will be described with reference to an energy band diagram shown in FIG. 4B. FIG. 4B diagrammatically shows an energy band structure in the vicinity of a MQW light detecting layer 42 provided between an n-type GaN layer 41 and a p-type GaN layer 43. For the sake of simplicity, it is assumed in FIG. 4B that the MQW light detecting layer 42 has a single-quantum well structure (hereinafter, unless otherwise specified, the single-quantum well structure is also referred to as the MQW structure).

In the photodetector of Example 1, as shown in FIG. 4B, in the absence of applied bias voltage, a piezoelectric field due to a difference in the lattice constant between the InGaN layer and GaN layer included in the light detecting layer 42 has a direction opposite to that of an electric field due to the pn junction between the n-type GaN layer 41 and the p-type GaN layer 43. The reverse bias externally applied overcomes the piezoelectric field. The increased reverse bias leads to a reduction in the electric field applied across the MQW light detecting layer 42. The energy band in the MQW light detecting layer 42 becomes flat. This causes the transition energy to be increased, thereby shifting the light detection peak wavelength toward a short wavelength.

On the other hand, in FIG. 4A, the light detection peak wavelength (characteristics indicated with white circles) of the conventional photodetector including the InGaN thick film as the light detecting layer is substantially constant even when the externally applied voltage is changed.

Further, black squares indicate a change in photosensitivity due to a change in externally applied voltage of the photodetector of Example 1.

Figure 5:
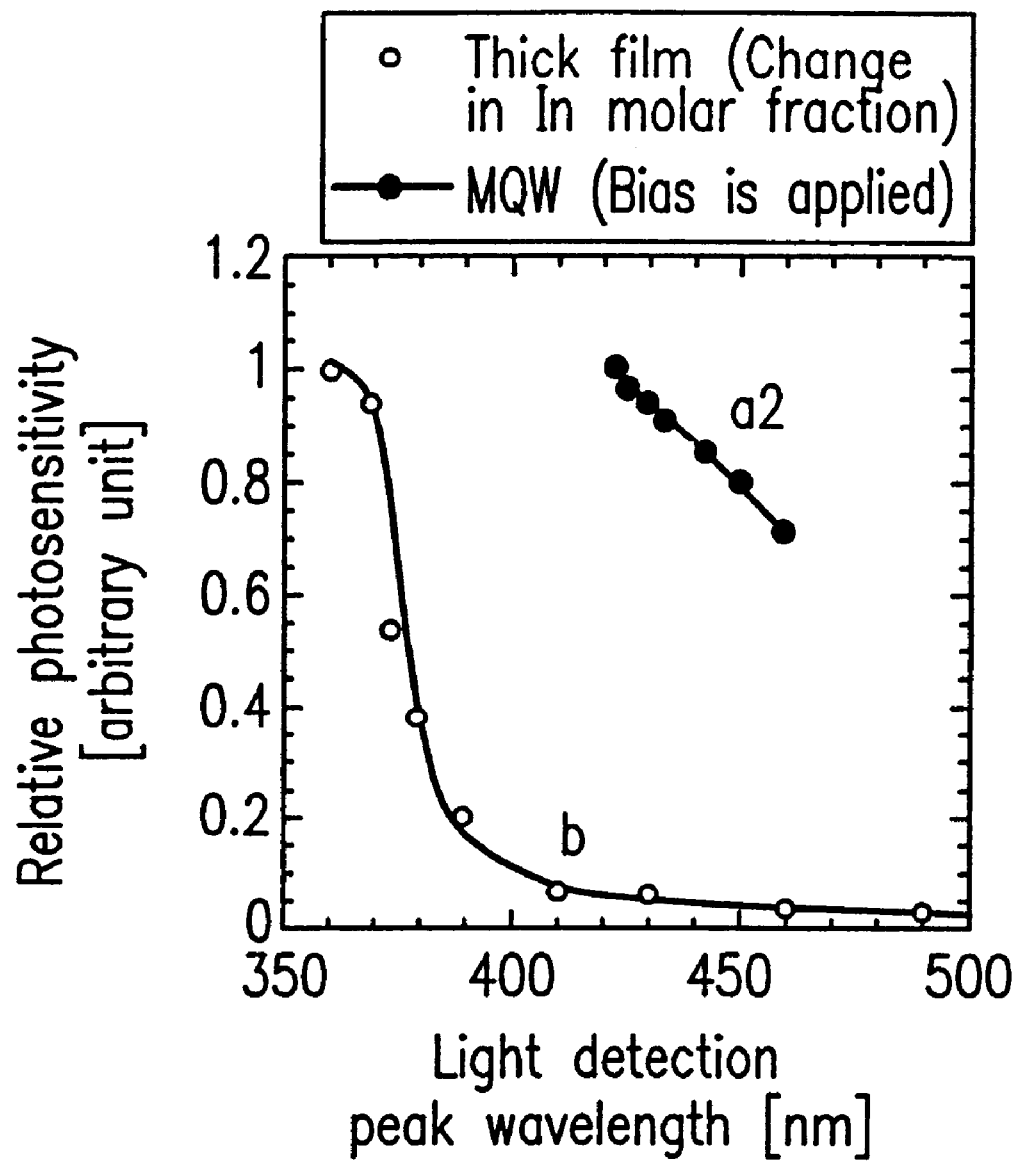
FIG. 5 is a diagram showing a relationship between the light detection peak wavelength and photosensitivity of the photodetector according to Example 1 of this invention (in the presence of reverse bias) or the conventional photodetector (the In molar fraction of the light detecting layer is changed).

A change in photosensitivity due to the externally applied voltage versus the light detection peak wavelength is plotted in FIG. 5 where the vertical axis represents the photosensitivity and the horizontal axis represents the light detection peak wavelength. In FIG. 5, curve a2 indicates characteristics of the photodetector of Example 1. Such characteristics are obtained by externally applying a bias voltage across the InGaN/GaN MQW structure of the light detecting layer so as to change the light detection peak wavelength. Curve b indicates characteristics of the conventional photodetector including the light detecting layer of an InGaN film having a thickness of about 0.1 μm. Specifically, a number of photodetectors having different In molar fractions were prepared. The photosensitivity of each photodetector was measured at its light detection peak wavelength.

As a result, it was demonstrated that the photodetector of Example 1 in which the light detecting layer having the MQW structure has a photosensitivity improved by a factor of about 15 in the light detection peak wavelength range of about 420 nm to about 460 nm as compared with the conventional photodetector.

The light detection peak wavelength of the photodetector of Example 1 can be controlled by changing the external bias voltage. It is therefore possible to detect a wide wavelength range of light with a single photodetector. In the conventional photodetector, the light detecting layer is made of the InGaN thick film and the light detection peak wavelength is controlled by changing the In molar fraction. This structure leads to a small change in the light detection peak wavelength in response to a change in the external bias voltage as shown in FIG. 4A. For this reason, a plurality of photodetectors having different In molar fractions are required to efficiently detect light having different wavelengths.

The photodetector of Example 1 shown in FIG. 5 has a light detection peak wavelength of about 460 nm when the applied voltage is 0 V. Other photodetectors of Example 1 having different In molar fractions of the light detecting layer were tested. When a reverse bias voltage was applied to those photodetectors, detected wavelengths (light detection peak wavelengths) were shifted toward a shorter wavelength with an increase in the applied reverse bias voltage. Within the wavelength range of about 390 nm to about 500 nm, it was demonstrated that the photosensitivity is improved by a factor of about 5 to about 16 as compared with the conventional photodetector including the InGaN thick film as the light detecting layer.

In the description of Example 1, a SiC substrate is used as the substrate 11. A GaN substrate may be substituted for the SiC substrate. In such a case, the multilayer structure is also provided in a direction parallel to the c axis of the gallium nitride group compound semiconductor layer so that the piezoelectric field is generated significantly in a direction perpendicular to the growing surface.

EXAMPLE 2

Figure 6A:
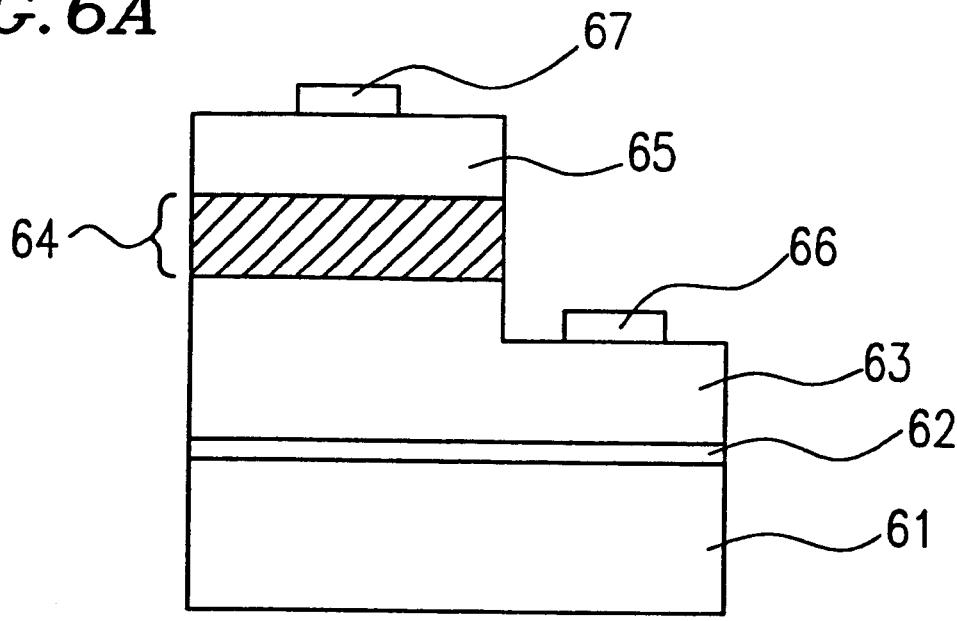
FIG. 6A is a cross-sectional view illustrating a structure of a photodetector according to Example 2 of this invention.

FIG. 6A is a cross-sectional view illustrating a structure of a photodetector according to Example 2 of this invention.

Specifically, the photodetector shown in FIG. 6A includes an AlN buffer layer 62 (about 40 nm thick), a GaN:Mg layer 63 (about 3 μm thick), a Multi-Quantum-Well (MQW) light detecting layer 64 including about 20 sets of an $In_{0.12}Ga_{0.88}N$ layer (about 4 nm thick) and a GaN layer (about 6 nm thick); and a GaN:Si layer 65 (about 1 μm thick), which are successively provided on the (0001) plane of a sapphire substrate 61. The GaN:Mg layer 63 in the multilayer structure has been subjected to annealing to become a low resistance p-type GaN layer 63. The photodetector further includes a p-side electrode 66 of Ni—Au provided on an exposed surface of the p-type GaN layer (GaN:Mg layer) 63 and an n-side electrode 67 of Ti—Al on the GaN:Si layer 65. Note that a direct current ammeter was connected between the electrodes 66 and 67 when light detection characteristics (photocurrent spectra) were measured as described below.

The photodetector thus obtained was irradiated with monochromatic light from above the GaN:Si layer 65. The monochromatic light is obtained by separating white light of a xenon lamp into a spectrum. The photodetector of Example 2 having the structure shown in FIG. 6A has a light detection peak wavelength of about 410 nm. The light detection peak wavelength refers to the wavelength at which the current is maximum in the photocurrent spectra measured using the above-mentioned method. The relative photosensitivity to light having this wavelength is about 0.93. To compare with the photodetector of Example 2, a photodetector including a single $In_{0.17}Ga_{0.83}N$ layer having a thickness of about 0.1 μm as a light detecting layer (the light detection peak wavelength is about 410 nm which is the same as that of Example 2 ) was prepared and the photosensitivity thereof was measured in a similar way. The relative photosensitivity to light having a wavelength of about 410 nm is about 0.07. Thus, it was demonstrated that the MQW structure of the light detecting layer 64 leads to an improvement in photosensitivity by a factor of about 13.

In the multilayer structure as shown in FIG. 6A including the InGaN layers and the GaN layers, a difference in the lattice constant between an InGaN layer and a GaN layer causes a large compressive strain which is applied to the InGaN layer. A large internal electric field (piezoelectric field) is generated due to the piezoelectric effect caused by the compressive strain. The direction of the internal electric field thus generated is the same as that of an electric field caused by a pn junction. In Example 2, the light detecting layer has the quantum well structure. In accordance with the quantum confinement Stark effect, transition energy is more decreased in the presence of an electric field due to the piezoelectric effect than in the absence of an electric field (the light detection peak wavelength is shifted toward a longer wavelength). In other words, a smaller In molar fraction is required for Example 2 to obtain the same light detection peak wavelength. For instance, to obtain a light detection peak wavelength of about 410 nm, the conventional InGaN thick film light detecting layer needs an In molar fraction of about 0.17, while the MQW light detecting layer of Example 2 needs an In molar fraction of about 0.12.

A plurality of photodetectors having different light detection peak wavelengths were prepared by changing the In molar fraction of the light detecting layers. The relationship between the light detection peak wavelengths and the relative photosensitivity (described above) was obtained. The result is shown in FIG. 7.

Figure 7:
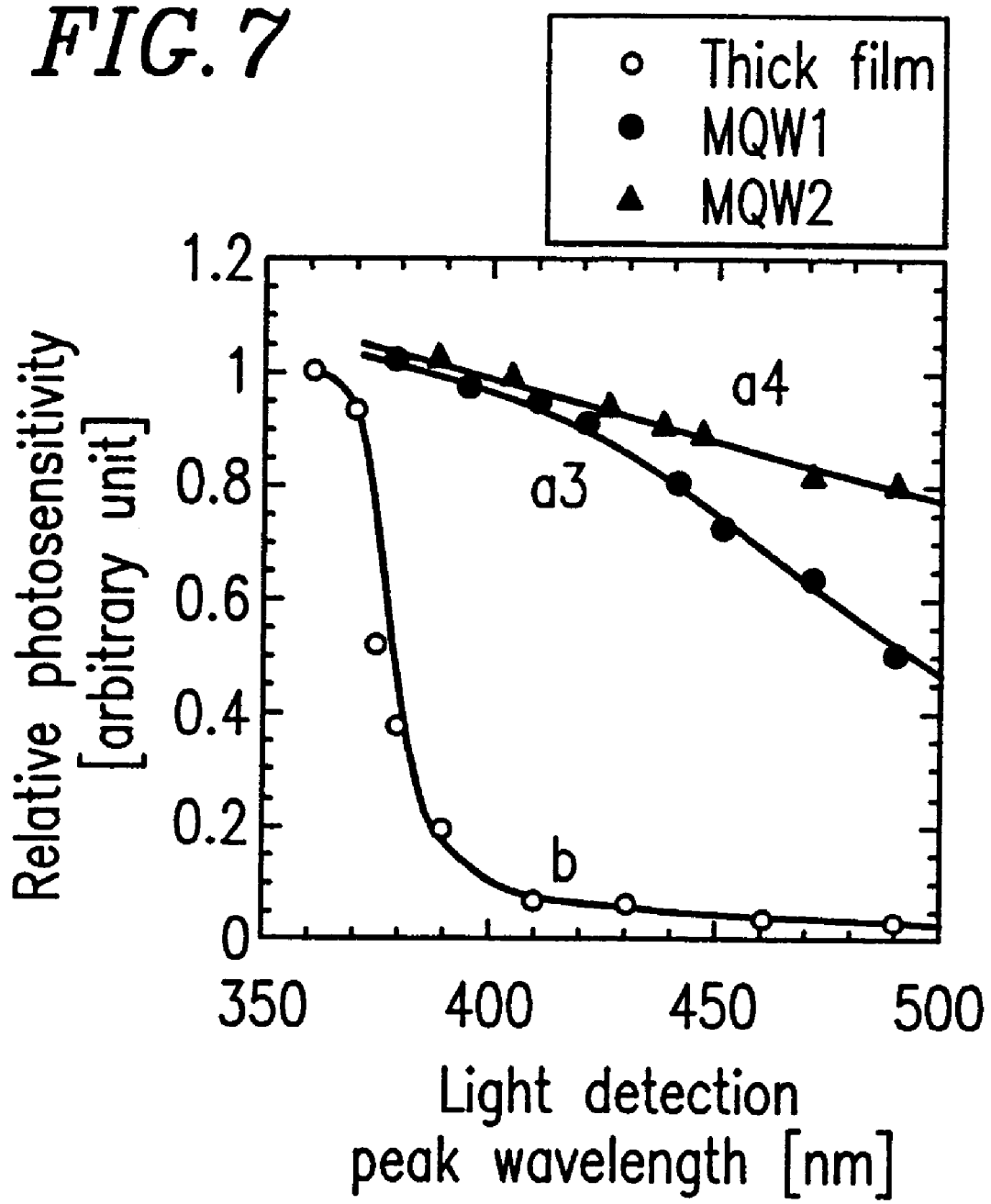
FIG. 7 is a diagram showing a relationship between the light detection peak wavelength and photosensitivity of the photodetector according to Example 2 of this invention or the conventional photodetector.

Curve b in FIG. 7 indicates characteristics of the conventional photodetector including the InGaN thick film having a thickness of about 0.1 μm for the light detecting layer. The longer the light detection peak wavelength, the more significant the reduction in photosensitivity. The reason is as described above in Example 1. An increased In molar fraction of the light detecting layer is required to obtain a photodetector having a long light detection peak wavelength. The increased In molar fraction leads to prevention of the InGaN thick film from having satisfactory crystallinity. The more the In molar fraction (the longer the light detection peak wavelength), the more the degradation in crystallinity of the light detecting layer.

On the other hand, curve a3 in FIG. 7 indicates characteristics of the photodetector of Example 2 including the light detecting layer having the InGaN/GaN MQW structure. As compared with curve b indicating the conventional characteristics (the case of the InGaN thick film), the photosensitivity is improved by a factor of about 2.7 at a light detection peak wavelength of about 380 nm; about 13 at about 410 nm; and about 15 at about 450 nm. Thus, as compared with the case of the conventional InGaN thick film light detecting layer, a smaller amount of In is required to obtain a light detecting layer having a longer light detection peak wavelength. This is because the light detection peak wavelength is shifted due to the quantum confinement Stark effect in the presence of the piezoelectric field caused by the lattice strain. Therefore, the problem with the conventional InGaN thick film light detecting layer with the increased In amount leading to a degradation in crystallinity of the light detecting layer can be avoided, thereby obtaining an improvement in photosensitivity.

Even as to the characteristics a3, the longer the light detection peak wavelength, the lower the photosensitivity. Similar to Example 1, the following two functions are responsible for this reduction. One of the two functions is the degradation of crystallinity which occurs in the MQW structure due to an increase in the In molar fraction, though it is not as significant as in the thick film. The other cause is as follows. The more the In molar fraction, the more the strain amount due to a difference in the lattice constant. The increased strain amount causes the piezoelectric effect which leads to an increase in an electric field applied to the quantum well. This further leads to a decrease in oscillator strength, thereby reducing an optical transition probability.

Curve a4 in FIG. 7 shows characteristics of a photo detector of Example 2. This photodetector includes a light detecting layer 64 having a structure shown in FIG. 6A where the structure is a MQW structure of $In_xGa_{1-x}N$ (well layer) and $In_yGa_{1-y}N$ (barrier layer) (where x>y). The n-type GaN layer 65 and the p-type GaN layer 63 included in the photodetector each have an $In_yGa_{1-y}N$ layer as a part. In particular, the In molar fraction (y) of the barrier layer was controlled so that constant strain is applied to the well layer in spite of a change in the In molar fraction, thereby generating a piezoelectric field having a constant magnitude. In this case, even when the In molar fraction is increased, a change in the electric field intensity does not lead to a reduction in photosensitivity. As compared with the case of curve a3, a reduction in photosensitivity to a longer wavelength is small in the photodetector of Example 2.

Figure 8:
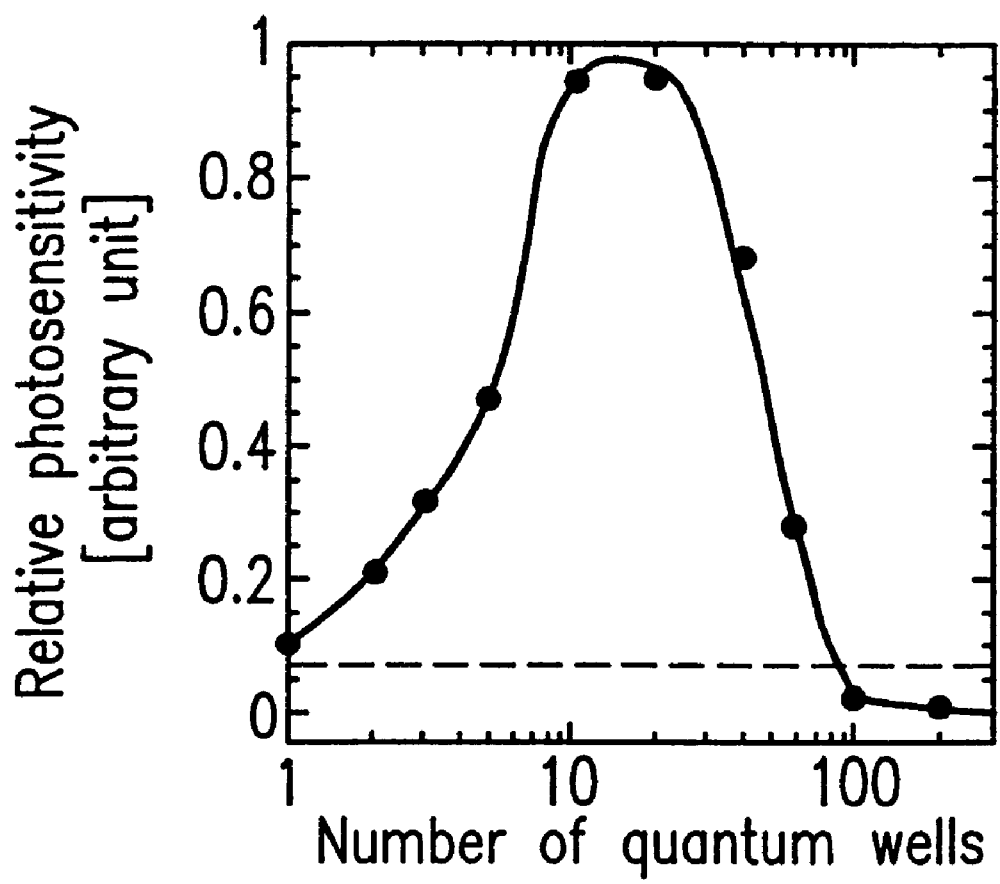
FIG. 8 is a diagram showing a relationship between the number of quantum well layers and photosensitivity of the photodetector according to Example 2 of this invention.

A plurality of photodetectors each having a different number of quantum well layers included in the MQW structure of the light detecting layer were prepared (the light detection peak wavelength of any photodetector is about 410 nm). The photosensitivity of each photodetector was measured. The result is shown in FIG. 8. The thicknesses of the InGaN well layer and the GaN barrier layer were about 4 nm and about 6 nm, respectively. A dashed line in FIG. 8 indicates the photosensitivity of the conventional photodetector having the InGaN thick film as the light detecting layer. The relative photosensitivity to light having a light detection peak wavelength of about 410 nm is 0.07.

In FIG. 8, when the number of quantum well layers is 1, i.e., the light detecting layer has a single-quantum well layer structure, it does not appear that there is a large improvement in photosensitivity compared with the conventional photodetector including the InGaN thick film as the light detecting layer. However, this does not mean that an improvement in photosensitivity is not actually obtained. Each quantum well layer is very thin, so that the number of carriers generated when light is absorbed in the quantum well layer is small. This is responsible for the above-described value of photosensitivity. If the value is converted into a photosensitivity per unit thickness, it is understood that the photosensitivity is improved by a factor of about 25 as compared with the conventional photodetector.

Further, as is seen from FIG. 8, the increased number of quantum well layers included in the MQW structure of the light detecting layer leads to an increase in the total number of carriers generated by light absorption, resulting in an increase in current generated by light detection. It is understood that the photosensitivity is significantly increased with an increase in the number of quantum wells up to about 10–20. For instance, when the number of quantum wells is about 20, the photosensitivity is improved by a factor of about 13 as compared with the conventional photodetector having the InGaN thick film light detecting layer.

When the number of quantum wells is more than about 20, the overall thickness of the light detecting layer becomes large. This causes relaxation of lattice strain, resulting in a degradation in crystallinity. In the photodetector including more than about 20 quantum well layers, the more the number of quantum wells, the lesser the photosensitivity. When the number of quantum wells is about 70, the photosensitivity is lower than that of the conventional photodetector having the InGaN thick layer.

As described above, it was demonstrated that the photodetector of Example 2 including the light detecting layer having the MQW well structure has improved photosensitivity as compared with the conventional photodetector having the InGaN thick film light detecting layer when the number of quantum wells (the number of quantum well layers) is in the range of 1 to 70. More particularly, when the number of quantum wells is in the range of about 5 to about 50, it was demonstrated that the photosensitivity is improved by a factor of about 7 to about 13 as compared with the photodetector having the InGaN thick film light detecting layer.

Figure 9:
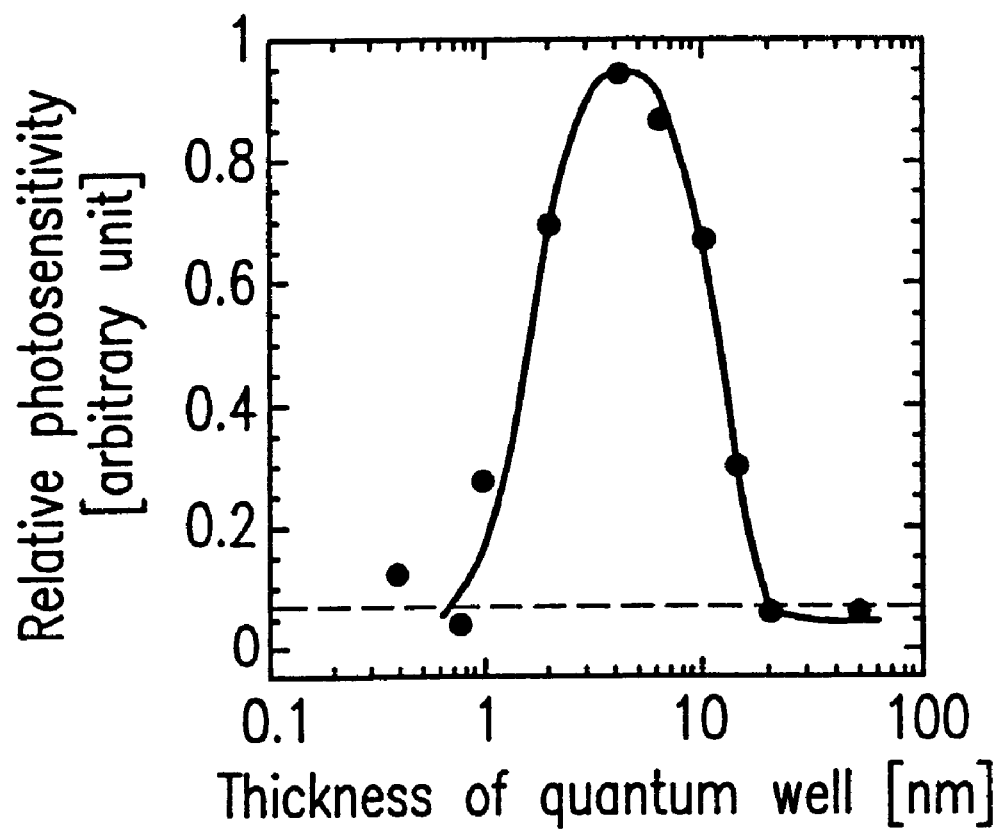
FIG. 9 is a diagram showing a relationship between the thickness of a quantum well layer and photosensitivity of the photodetector according to Example 2 of this invention.

A plurality of photodetectors each including a quantum well layer having a different thickness (quantum well width) were prepared. The photosensitivity of each photodetector was measured. The result is shown in FIG. 9. When the thickness of the quantum layer (quantum well width) is changed, the light detection peak wavelength is also changed. To obtain a constant light detection peak wavelength, the In molar fraction was appropriately controlled. Note that the number of quantum wells was set to about 20. A dashed line in FIG. 9 indicates the photosensitivity of the conventional photodetector including the InGaN thick film as the light detecting layer. As in FIG. 8, the relative photosensitivity to light having a light detection peak wavelength of about 410 nm is about 0.07.

As is seen from FIG. 9, when the quantum well layer is thin (the quantum well width is small), there occurs variations in photosensitivity. This is because it is difficult to control the composition and thickness of the thin MQW layer, resulting in low reproducibility. When the quantum well layer is thick, the overall thickness of the light detecting layer is increased, resulting in lattice relaxation. This leads to prevention of satisfactory crystal, thereby reducing the photosensitivity.

An improvement in photosensitivity was observed when the thickness of the quantum well layer (quantum well width) was in the range of about 1 nm to about 15 nm, in which range the above-described problems were avoided. More particularly, in the range of about 2 nm to about 10 nm, it was demonstrated that the photosensitivity is improved at a factor of about 9 to about 13 as compared with the conventional photodetector having the InGaN thick film light detecting layer.

A preferable range of the number of quantum wells (quantum well number) included in the MQW structure of the light detecting layer and the preferable range of the thickness of each quantum well layer (quantum well width) which are described with reference to FIGS. 8 and 9, can be applied to the photodetector of Example 1.

Figure 10A:
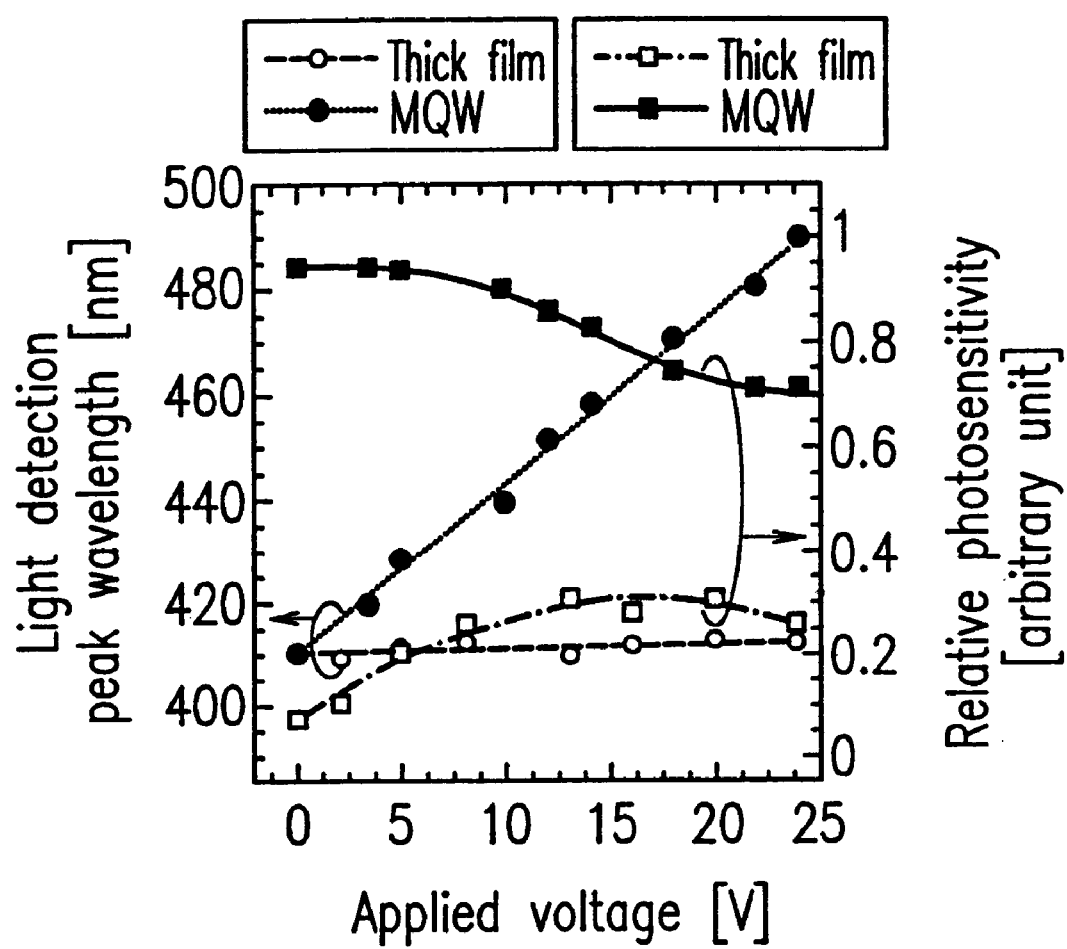
FIG. 10A is a diagram showing a relationship between external applied voltage and light detection peak wavelength and a relationship between the external applied voltage and photosensitivity, of the photodetector according to Example 2 of this invention or the conventional photodetector.

FIG. 10A is a diagram showing a result of the measurement of changes in a light detection peak wavelength and photosensitivity which are obtained in the presence of voltage externally applied to the photodetector of Example 2. The p side of the photodetector is biased to be negative and the n side is biased to be positive so that the pn junction is reverse biased by the applied voltage.

Figure 10B:
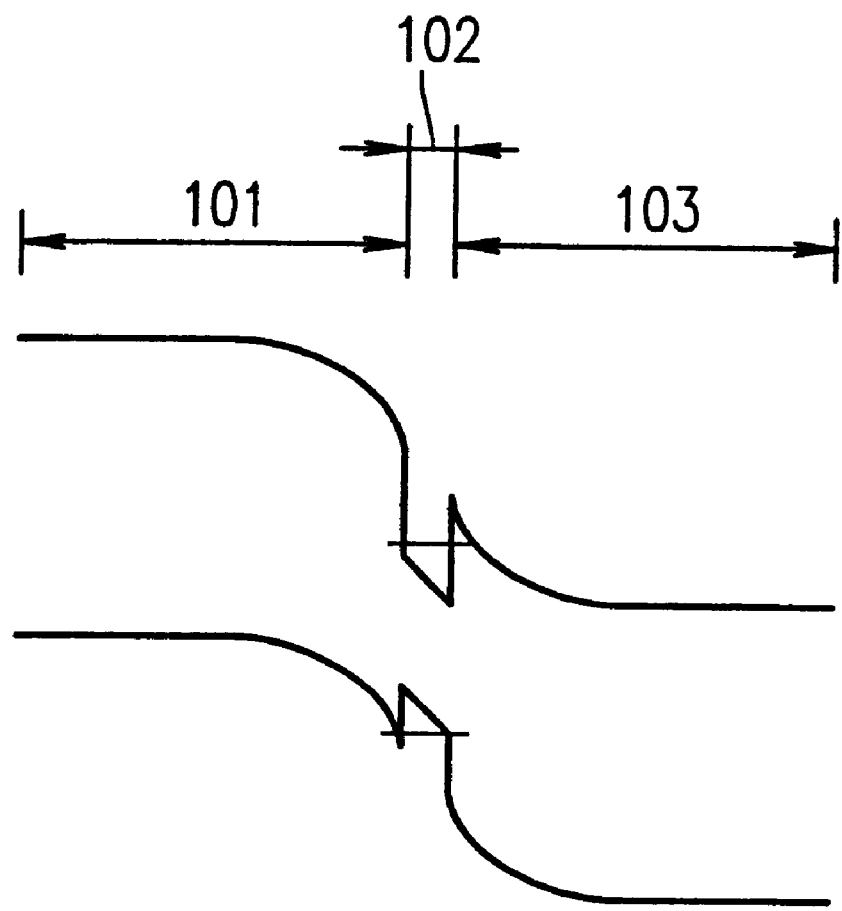
FIG. 10B is a diagram showing an energy band structure in the vicinity of the light detecting layer of the photodetector according to Example 2 of this invention.

Black circles in FIG. 10A represent a change in the light detection peak wavelength of the photodetector of Example 2. The light detection peak wavelength is shifted toward a long wavelength with an increase in the applied voltage (reverse bias voltage). This point will be described with reference to an energy band diagram shown in FIG. 10B. FIG. 10B diagrammatically shows an energy band structure in the vicinity of a MQW light detecting layer 102 provided between an n-type GaN layer 103 and a p-type GaN layer 101. For the sake of simplicity, it is assumed in FIG. 10B that the MQW light detecting layer 102 has a single-quantum well structure.

In the photodetector of Example 2, as shown in FIG. 10B, a piezoelectric field due to a difference in the lattice constant between the InGaN layer and the GaN layer included in the light detecting layer 102 has the same direction as that of an electric field due to the pn junction between the n-type GaN layer 103 and the p-type GaN layer 101. The reverse bias voltage externally applied allows the piezoelectric field larger than in the absence of applied voltage to be applied across the quantum well light detecting layer 102. As a result, the transition energy is reduced due to the quantum confinement Stark effect, thereby shifting the light detection peak wavelength toward a long wavelength.

As described in Example 2, when the generated piezoelectric field has the same direction as that of the electric field generated by the pn junction, it is possible to obtain the photodetector with satisfactory photosensitivity in a longer wavelength in the presence of applied reverse bias voltage than in the absence of the applied reverse bias voltage. The utilization of this property allows the photodetector having a given light detection peak wavelength to be obtained using a smaller In molar fraction. The reduced In molar fraction of the light detecting layer leads to an improvement in the crystallinity of the light detecting layer, thereby obtaining a further improvement in photosensitivity.

On the other hand, in FIG. 10A, the light detection peak wavelength (characteristics indicated with white circles) of the conventional photodetector including the InGaN thick film as the light detecting layer is substantially constant even when the externally applied voltage is changed.

Further, black squares indicate a change in photosensitivity due to a change in the externally applied voltage of the photodetector of Example 2.

Figure 11:
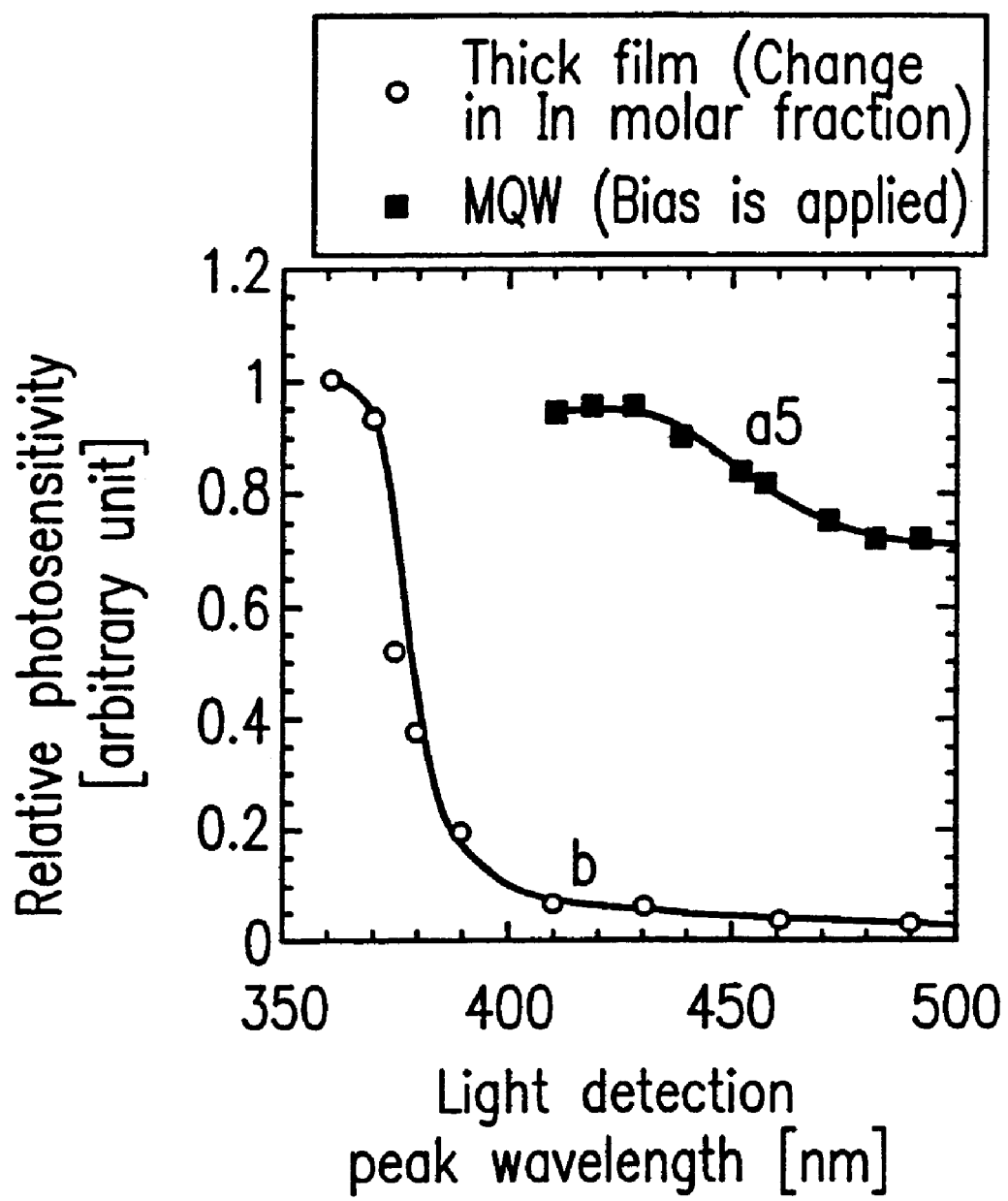
FIG. 11 is a diagram showing a relationship between the light detection peak wavelength and photosensitivity of the photodetector according to Example 2 of this invention (in the presence of reverse bias) or the conventional photodetector (the In molar fraction of the light detecting layer is changed).

A change in photosensitivity due to externally applied voltage versus the light detection peak wavelength is plotted in FIG. 11 where the vertical axis represents the photosensitivity change and the horizontal axis represents the light detection peak wavelength. In FIG. 11, curve a5 indicates characteristics of the photodetector of Example 2. Such characteristics are obtained by externally applying the bias voltage across the $In_{0.12}Ga_{0.88}N$ (about 4 nm thick)/GaN (about 6 nm thick) MQW structure (20 sets) of the light detecting layer to change the light detection peak wavelength. Curve b indicates characteristics of the conventional photodetector including the light detecting layer of an InGaN film having a thickness of about 0.1 $\mu$m. Specifically, a number of photodetectors having different In molar fractions were prepared. The photosensitivity of each photodetector was measured at its light detection peak wavelength.

As a result, it was demonstrated that the photodetector of Example 1, in which the light detecting layer has the MQW structure, has improved photosensitivity by a factor of about 13 to about 18 in the light detection peak wavelength range of about 410 nm to about 500 nm as compared with the conventional photodetector.

The light detection peak wavelength of the photodetector of Example 2 can be controlled by changing the external bias voltage. It is therefore possible to detect a wide wavelength range of light with a single photodetector. In the conventional photodetector, the light detecting layer is made of the InGaN thick film and the light detection peak wavelength is controlled by changing the In molar fraction. This structure leads to a small change in the light detection peak wavelength in response to a change in external bias voltage as shown in FIG. 10A. For this reason, a plurality of photodetectors having different In molar fractions are required to efficiently detect light having different wavelengths.

The photodetector of Example 2 shown in FIG. 11 has a light detection peak wavelength of about 410 nm when the applied voltage is 0 V. Other photodetectors of Example 2 having different In molar fractions of the light detecting layer were tested. When a reverse bias voltage was applied to those photodetectors, detected wavelengths (light detection peak wavelengths) were shifted toward a longer wavelength with an increase in the applied reverse bias voltage. Within the wavelength range of about 390 nm to about 500 nm, it was demonstrated that the photosensitivity was improved by a factor of about 6 to about 18 as compared with the conventional photodetector including the InGaN thick film as the light detecting layer.

In the description of Example 2, the photodetector is formed on the (0001) plane of the sapphire substrate. This invention is not limited to the (0001) plane. A GaN substrate may be substituted for the sapphire substrate. In such a case, the multilayer structure is also provided in a direction parallel to the c-axis of the gallium nitride group compound semiconductor layer so that the piezoelectric field is generated significantly in a direction perpendicular to the growing surface. This leads to a further improvement in photosensitivity, thereby obtaining the same effects as described in the foregoing description in Example 2.

Further, in the description of Example 2, the photodetector is irradiated with light from above the GaN:Si layer 65. Since light in a blue-violet region is transmitted through the sapphire substrate 61, the photodetector may be irradiated from below the substrate 61 so that light reaches the light detecting layer 64. When the photodetector is irradiated with light from above the GaN:Si layer 65, there is a problem in that part of the incident light is blocked by the electrode 67 and the amount of the light reaching the light detecting layer 64 is decreased, resulting in a reduction in an amount of current generated by the light. Such a problem can be avoided when the photodetector may be irradiated from below the substrate 61.

Figure 6B:
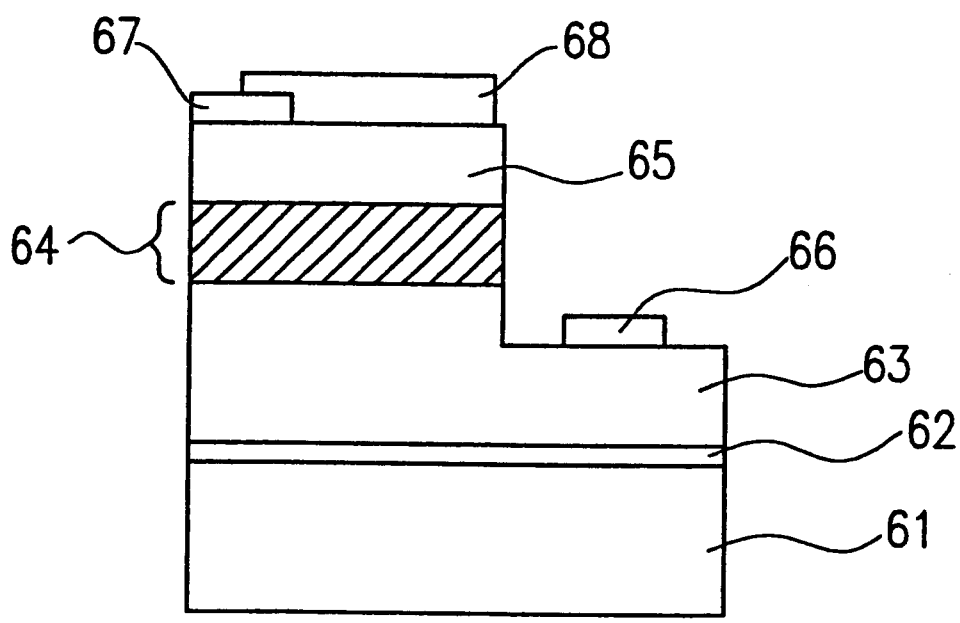
FIG. 6B is a cross-sectional view illustrating a structure of another photodetector according to Example 2 of this invention in which a reflection film is provided.

When the photodetector may be irradiated from below the substrate 61, a reflection film 68 may be provided on the GaN:Si layer 65 as shown in FIG. 6B. In this case, light which enters through the substrate 61 but is not absorbed in the light detecting layer 64 is reflected by the reflection film 68 and transmited through the light detecting layer 64 again. This leads to an increase in efficiency of light detection. Further, the amount of current by the light detection is increased. Like parts are referred to by like numerals in FIGS. 6A and 6B. Therefore, the description of these parts is omitted.

A material of the reflection film 68 is, although not limited hereby, any material which has a high reflectivity with respect to the wavelength of incident light. A variety of materials such as dielectric material films and metal films may be suitable. A film having a multilayer structure can substitute for a single-layer film.

As described above, in FIG. 6B, the GaN:Mg layer 63, the MQW light detecting layer 64, and the GaN:Si layer 65 are successively provided on the sapphire substrate 61 in this order. The reflection film 68 is further provided on the GaN:Si layer 65 and the photodetector is irradiated from below the substrate 61. Instead of this arrangement, the GaN:Si layer 65, the MQW light detecting layer 64, and the GaN:Mg layer 63 may successively be provided on the sapphire substrate 61 in this order. The same effects as described above can be obtained by this arrangement.

In the description of the foregoing Examples, the piezoelectric field due to the strain is oriented along the c axis of the gallium nitride group compound semiconductor layer from an epi-surface (crystal growing surface) of the multilayer structure toward a substrate surface. Modification of the multilayer structure or the growth conditions thereof causes the direction of the piezoelectric field to be changed. The piezoelectric field may be oriented along the c-axis of the gallium nitride group compound semiconductor layer from the substrate surface toward the epi-surface, i.e., in a direction opposite to that described above. Even when the direction of the piezoelectric filed is different from that of the above-described Examples (e.g., the opposite direction), much of the above-described photosensitivity can be obtained. That is, as much as the above-described improvement in photosensitivity can be obtained.

A change in the light detection peak wavelength due to bias voltage externally applied is determined by a relative relationship between the direction of the piezoelectric field and the direction of an electric field caused by the pn junction. Specifically, when the direction of the piezoelectric field and the direction of an electric field caused by the pn junction are the same, the light detection peak wavelength is shifted toward a longer wavelength in the presence of the applied bias voltage as described in Example 2 with reference to FIGS. 10A and 10B. On the other hand, when the direction of the piezoelectric field is opposite to the direction of an electric field caused by the pn junction, the light detection peak wavelength is shifted toward a shorter wavelength in the presence of the applied bias voltage as described in Example 1 with reference to FIGS. 4A and 4B.

In the foregoing description, the widths (thicknesses) of a quantum well layer and a barrier layer which are included in the MQW structure are specified. Actually, surfaces (interfaces) of the quantum well layer and the barrier layer are not necessarily flat.

A cross section of the InGaN/GaN MQW structure was observed by an electron microscope. Based on this observation, the interfaces between the quantum well layers and the barrier layers, which are included in the MQW structure, are diagrammatically shown in FIG. 12.

Figure 12:
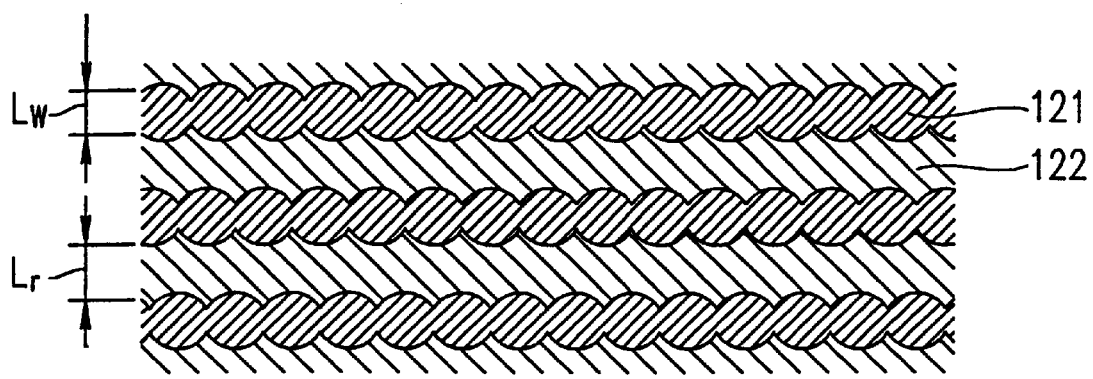
FIG. 12 is a diagram illustrating interfaces between quantum well layers and barrier layers, which are included in a multi-quantum well structure, based on a cross section of an InGaN/GaN MQW structure observed by an electron microscope.
Figure 13:
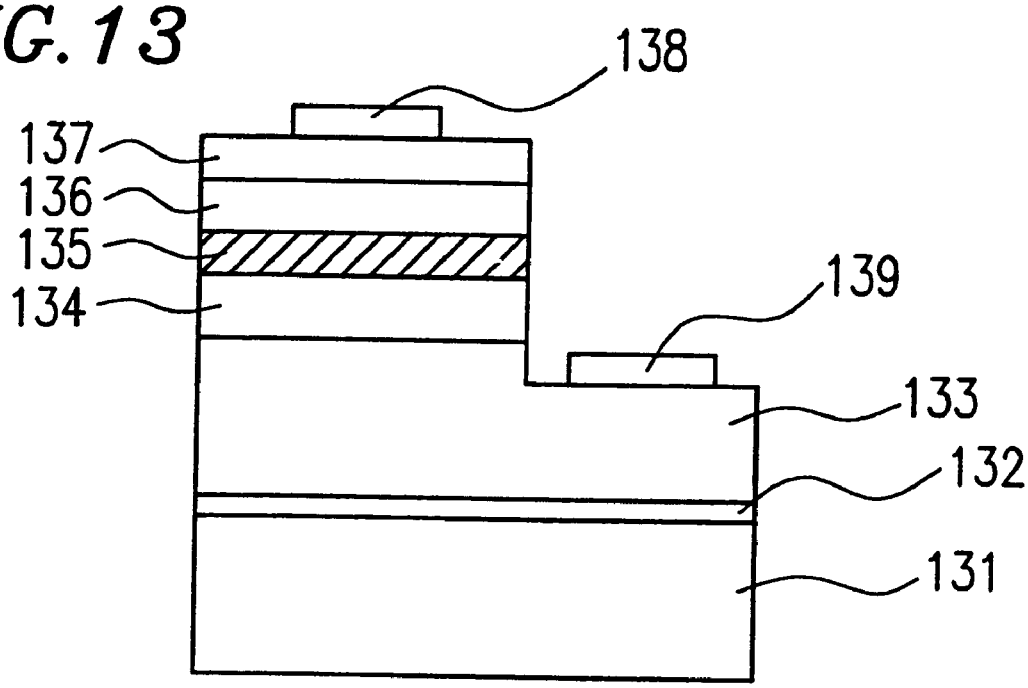
FIG. 13 is a cross-sectional view illustrating a structure of a conventional photodetector.
Figure 14:
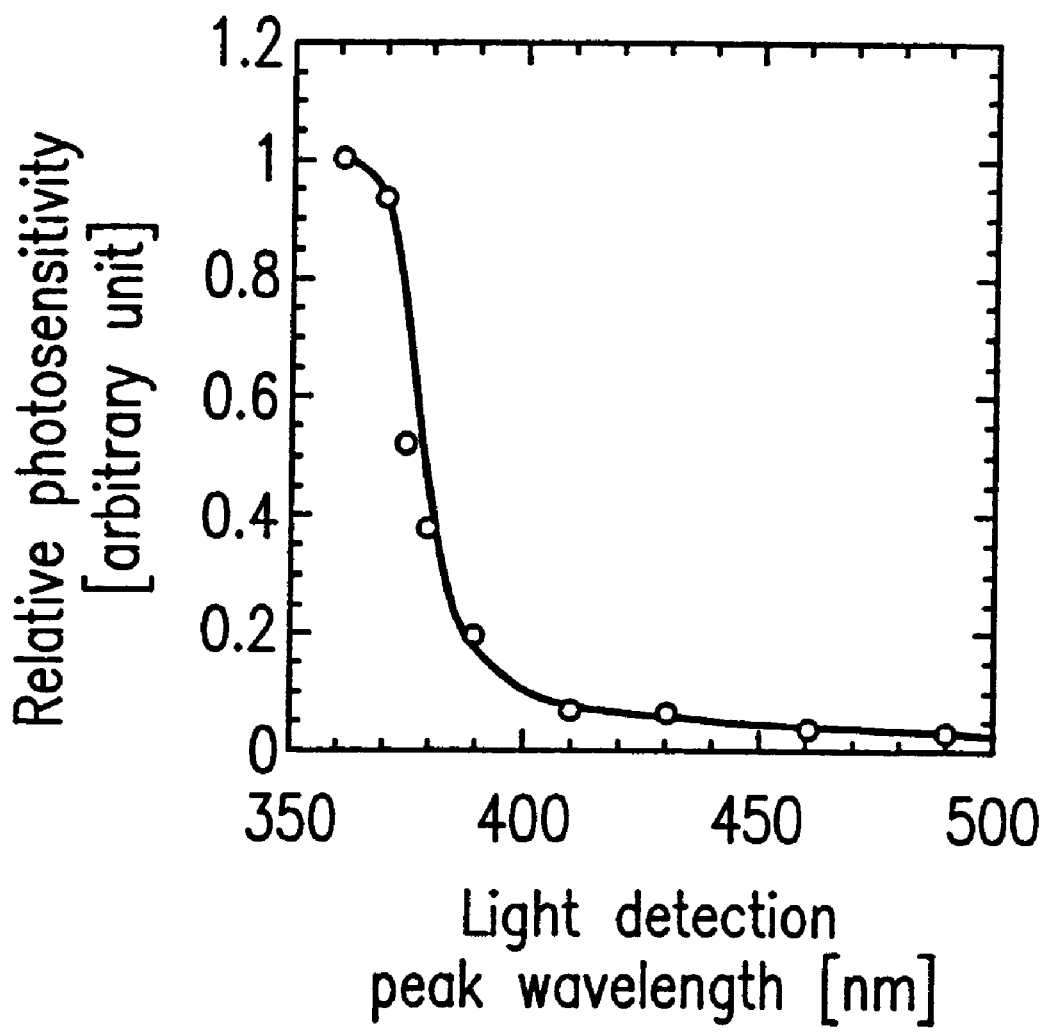
FIG. 14 is a diagram showing a result of measurement of photosensitivity to light having a light detection peak wavelength of the conventional photodetector shown in FIG. 13.

Growth of the InGaN layer is largely affected by manufacturing conditions. Although a grown layer may become flat, a surface of a region 121 including In (i.e., the InGaN quantum well layer in this case) may not be flat as shown in FIG. 12. Quantum dots may be congregated, so that the composition or the thickness along the growth direction varies along the growth surface.

In this invention, the quantum well region 121 having a high In molar fraction is referred to as a quantum well layer. A region 122 functioning as a barrier against the quantum well layer is referred to as a barrier layer. FIG. 12 shows Lw and Lr which represent the widths (thicknesses) of the quantum well layer 121 and the barrier layer 122, respectively. In the strict sense, Lw and Lr represent average widths (thicknesses) of the respective layer determined by observation of the cross section of the MQW structure.

In the description of each Example, InGaN or GaN is used as a material of the barrier layer. Other gallium nitride group compound semiconductors (e.g., InGaAlN) may be used. More particularly, the use of an InGaAlN barrier layer, which is a mixed crystal, allows the strain amount applied to the InGaN well layer to be controlled in a wide range. When the composition of the InGaAlN barrier layer is provided in such a way as to increase the strain amount of the InGaN layer, the internal electric field (piezoelectric field) due to the piezoelectric effect is increased, thereby further improving the photosensitivity.

In the description of each Example, the light detecting layer of this invention mainly includes the MQW structure. Even when the light detecting layer of this invention includes the single-quantum well structure, the above-described improvement in photosensitivity can be achieved.

As described above, the gallium nitride group compound semiconductor photodetector of this invention includes the light detecting layer having the quantum well structure (the MQW structure and the single-quantum well structure). In the photodetector of this invention, transition energy is changed due to the piezoelectric field generated by the lattice strain applied to the quantum well layer. By utilization of this phenomenon, it is possible to obtain the photodetector having the desired light detection peak wavelength using a smaller In molar fraction as compared with the case when the light detecting layer is made of a thick film. This leads to the minimization of degradation in crystallinity of the light detecting layer due to an increase in the In molar fraction. As a result, the photosensitivity is improved in the wavelength range of about 390 nm to about 500 nm.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gallium nitride group compound semiconductor photodetector comprising:
    a substrate; and
    a multilayer structure provided on the substrate,
    wherein the multilayer structure comprises:
        an n-type gallium nitride group compound semiconductor layer;
        a p-type gallium nitride group compound semiconductor layer; and
        a light detecting layer provided between the n-type gallium nitride group compound semiconductor layer and the p-type gallium nitride group compound semiconductor layer, the light detecting layer having high sensitivity in a range of wavelengths greater than 360 nm and having a quantum well structure with a relative photodetecting sensitivity equal to or more than 0.5, the quantum well structure comprising:

a quantum well layer of $In_xGa_{1-x}N$ (0<x<1); and
a barrier layer of $In_yGa_{1-y-z}Al_zN$ (0≦y<1, 0≦z≦1, y+z<1).

2. A gallium nitride group compound semiconductor photodetector according to claim 1, wherein the multilayer structure is integrally provided in a direction parallel to the c-axis of the gallium nitride group compound semiconductor layers which is extending in a direction vertical to an integrated plane of each layer of the multilayer structure.

3. A gallium nitride group compound semiconductor photodetector according to claim 1, wherein the substrate is any one of a sapphire substrate, a SiC substrate, and a GaN substrate.

4. A gallium nitride group compound semiconductor photodetector according to claim 1, wherein the quantum well structure of the light detecting layer is a single-quantum well structure.

5. A gallium nitride group compound semiconductor photodetector according to claim 1, wherein the quantum well structure of the light detecting layer is a multi-quantum well structure.

6. A gallium nitride group compound semiconductor photodetector according to claim 1, wherein the number of quantum well layers included in the quantum well structure of the light detecting layer is in the range of about 1 to about 70.

7. A gallium nitride group compound semiconductor photodetector according to claim 1, wherein the width of each quantum well layer included in the quantum well structure of the light detecting layer is in the range of about 1 nm to about 15 nm.

8. A gallium nitride group compound semiconductor photodetector according to claim 1, wherein the multilayer structure is formed so that a piezo-electric field is generated substantially in a vertical direction onto the multilayer surface.

9. A gallium nitride group compound semiconductor photodetector according to claim 1, wherein the number of quantum well layers included in the quantum well structure of the light detecting layer is from 5 to 50, and a thickness of the quantum well layer is in a range of 2 to 12 nm.

10. A gallium nitride group compound semiconductor photodetector according to claim 1, wherein light irradiation is conducted from the substrate side of the photodetector.

11. A gallium nitride group compound semiconductor photodetector according to claim 1, wherein light irradiation is conducted from the side of the semiconductor layer of the photodetector.

12. A gallium nitride group compound semiconductor photodetector according to claim 1, wherein a reflecting layer is formed on a plane opposite to a plane to be light irradiated.

13. A gallium nitride group compound semiconductor photodetector according to claim 1, wherein an electric field is loaded on the light detecting layer by an external voltage in the same direction to an internal electric field to be generated by piezoelectic effect within the quantum well layers.

14. A gallium nitride group compound semiconductor photodetector according to claim 1, wherein an electric field is loaded on the light detecting layer by an external voltage in an opposite direction to an internal electric field to be generated by piezoelectric effect within the quantum well layers.

15. A gallium nitride group compound semiconductor photodetector comprising:

a substrate; and
a multilayer structure provided on the substrate,
wherein the multilayer structure comprises:
an n-type gallium nitride group compound semiconductor layer;
a p-type gallium nitride group compound semiconductor layer; and
a light detecting layer provided between the n-type gallium nitride group compound semiconductor layer and the p-type gallium nitride group compound semiconductor layer, the light detecting layer having high sensitivity in a range of wavelengths greater than 360 nm and having a quantum well structure comprising:
a quantum well layer of $In_xGa_{1-x}N$ (0<x<1); and
a barrier layer of $In_yGa_{1-y-z}Al_zN$ (0 y<1.0 z1, y+z, 1), and
wherein the wavelength of detected light of the photodetector is controlled by an externally applied voltage.

16. A gallium nitride group compound semiconductor photodetector according to claim 1, wherein the multilayer structure has the n-type semiconductor layer located close to the substrate.

17. A gallium nitride group compound semiconductor photodetector according to claim 15, wherein the multilayer structure is integratedly provided in a direction parallel to the c-axis of the gallium nitride group compound semiconductor layers, which is extending in a direction vertical to an integrated plane of each layer of the multilayer structure.

18. A gallium nitride group compound semiconductor photodetector according to claim 15, wherein the substrate is any one of a sapphire substrate, a SiC substrate, and a GaN substrate.

19. A gallium nitride group compound semiconductor photodetector according to claim 15, wherein the quantum well structure of the light detecting layer is a single-quantum well structure.

20. A gallium nitride group compound semiconductor photodetector according to claim 15, wherein the quantum well structure of the light detecting layer is a multi-quantum well structure.

21. A gallium nitride group compound semiconductor photodetector according to claim 15, wherein the number of quantum well layers included in the quantum well structure of the light detecting layer is in the range of about 1 to about 70.

22. A gallium nitride group compound semiconductor photodetector according to claim 15, wherein the width of each quantum well layer included in the quantum well structure of the light detecting layer is in the range of about 1 nm to about 15 nm.

23. A gallium nitride group compound semiconductor photodetector according to claim 15, wherein the multilayer structure is formed so that a piezo-electric field is generated substantially in a vertical direction onto the multilayer surface.

24. A gallium nitride group compound semiconductor photodetector according to claim 15, wherein the number of quantum well layers included in the quantum well structure of the light detecting layer is from 5 to 50, and a thickness of the quantum well layer is in a range of 2 to 12 nm.

25. A gallium nitride group compound semiconductor photodetector according to claim 15, wherein the quantum well structure has a relative photodetecting sensitivity equal to or more than 0.5.

26. A gallium nitride group compound semiconductor photodetector according to claim 15, wherein light irradiation is conducted from the substrate side of the photodetector.

27. A gallium nitride group compound semiconductor photodetector according to claim 15, wherein light irradiation is conducted from the side of the semiconductor layer of the photodetector.

28. A gallium nitride group compound semiconductor photodetector according to claim 15, wherein a reflecting layer is formed on a plane opposite to a plane to be light irradiated.

29. A gallium nitride group compound semiconductor photodetector according to claim 15, Wherein an electric field is loaded on the light detecting layer by an external voltage in the same direction to an internal electric field to be generated by piezoelectric effect within the quantum well layers.

30. A gallium nitride group compound semiconductor photodetector according to claim 15, wherein an electric field is loaded on the light detecting layer by an external voltage in an opposite direction to an internal electric field to be generated by piezoelectric effect within the quantum well layers.

* * * * *